US006972081B2

(12) United States Patent
Wong

(10) Patent No.: US 6,972,081 B2
(45) Date of Patent: Dec. 6, 2005

(54) FABRICATION OF EMBEDDED VERTICAL SPIRAL INDUCTOR FOR MULTICHIP MODULE (MCM) PACKAGE

(75) Inventor: Kaiser H. Wong, Torrance, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/284,513

(22) Filed: Feb. 5, 2003

(65) Prior Publication Data

US 2004/0149585 A1 Aug. 5, 2004

(51) Int. Cl.[7] .......................... C25D 5/02; C25D 11/32; C25D 5/54; C25D 5/56

(52) U.S. Cl. ....................... 205/119; 205/118; 205/123; 205/157; 205/162; 205/164

(58) Field of Search ........................ 205/118, 123, 157, 205/162, 164, 119

(56) References Cited

U.S. PATENT DOCUMENTS

| | | | |
|---|---|---|---|
| 5,391,517 A | 2/1995 | Gelatos et al. | 437/190 |
| 5,674,787 A | 10/1997 | Zhao et al. | 437/230 |
| 5,891,513 A | 4/1999 | Dubin et al. | 427/98 |
| 5,936,298 A * | 8/1999 | Capocelli et al. | 257/531 |
| 6,116,863 A * | 9/2000 | Ahn et al. | 417/322 |
| 6,180,261 B1 * | 1/2001 | Inoue et al. | 428/626 |
| 6,355,153 B1 * | 3/2002 | Uzoh et al. | 205/87 |
| 2004/0178492 A1 * | 9/2004 | Tsukamoto et al. | 257/690 |

OTHER PUBLICATIONS

Merriam-Webster Online Dictionary (2 printouts).*

* cited by examiner

*Primary Examiner*—Edna Wong
(74) *Attorney, Agent, or Firm*—Oliff & Berridge, PLC

(57) ABSTRACT

A process for fabricating a vertical spiral inductor within a multichip module package is disclosed. The process consists of depositing a pattern of bottom lines by electroplating copper on a substrate and then depositing an insulation pattern. Next, depositing a pattern of permeable material to form a core and then depositing polyimide to define vias and permeable core insulation. The vias are filled by electroplating copper. The vertical spiral inductor is formed and defined by next depositing a pattern of top metal (e.g. copper) lines by electroplating wherein the top metal lines are staggered with respect to the bottom metal lines. Lastly a top protective layer is deposited. The core is made from a permeable or non-permeable material.

23 Claims, 6 Drawing Sheets

FIG. 3
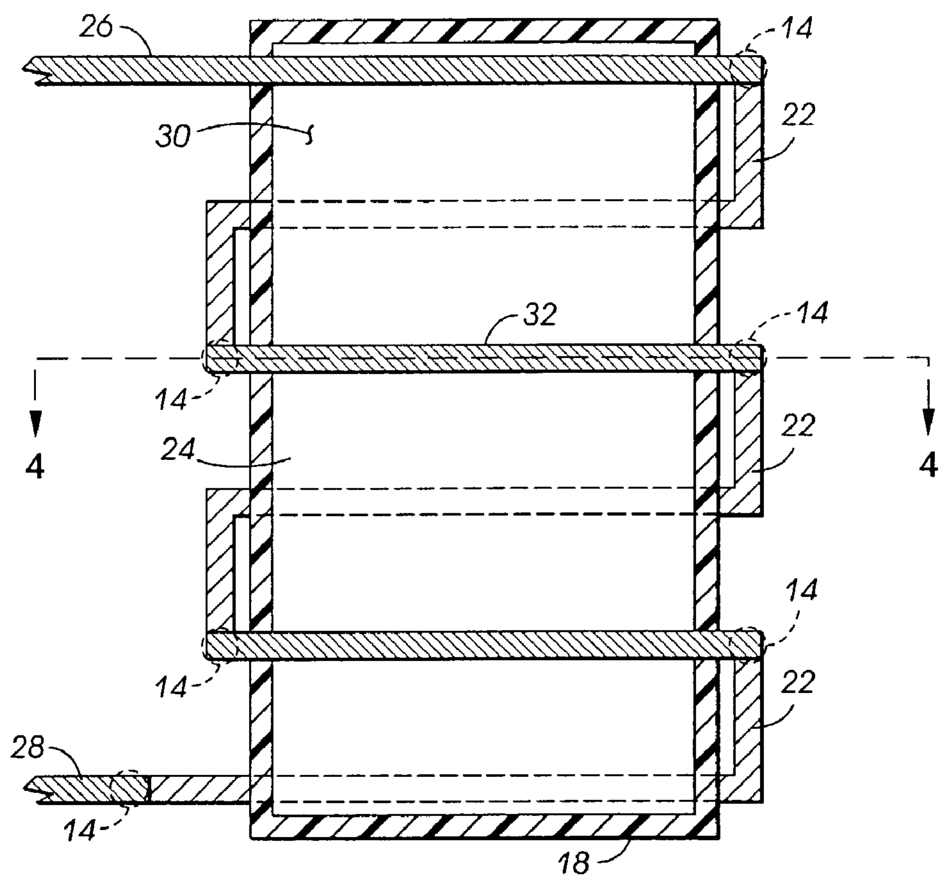
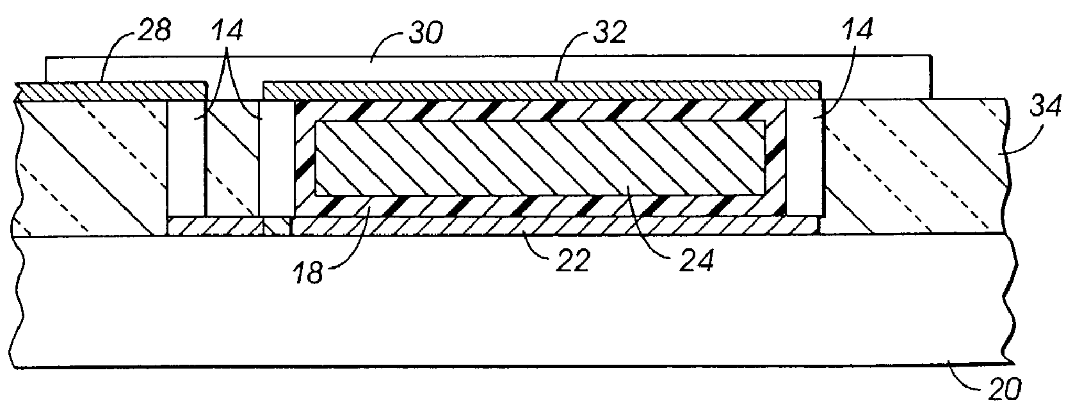
FIG. 4

FIG. 5
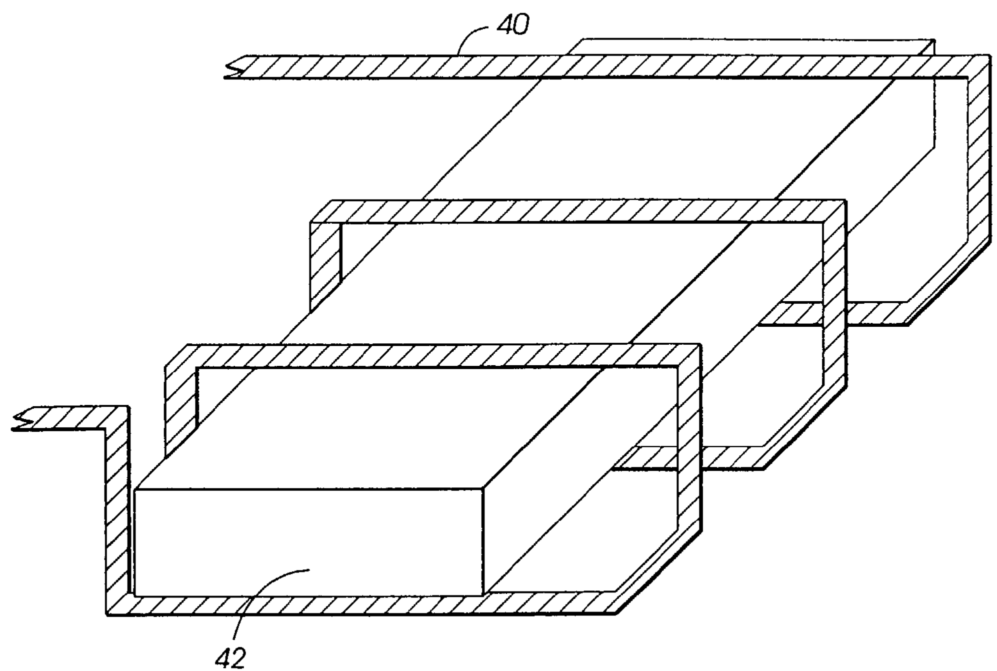
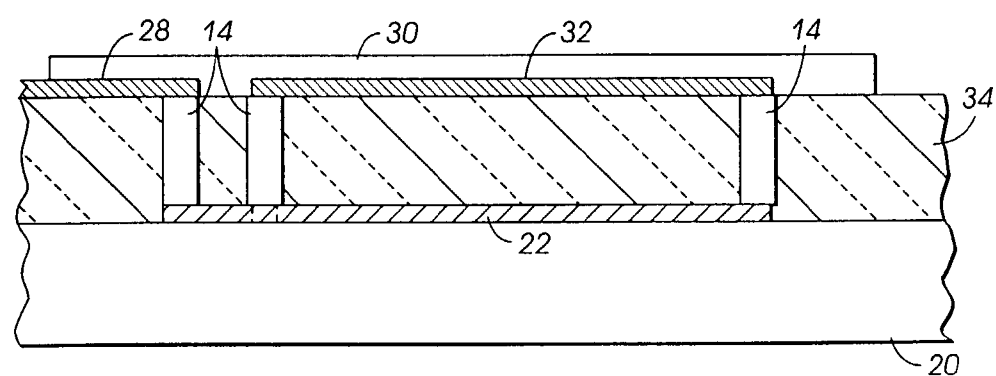
FIG. 6

FIG. 7
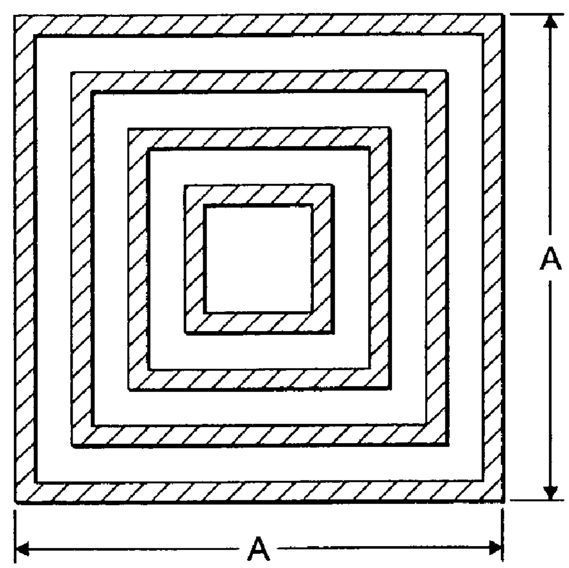
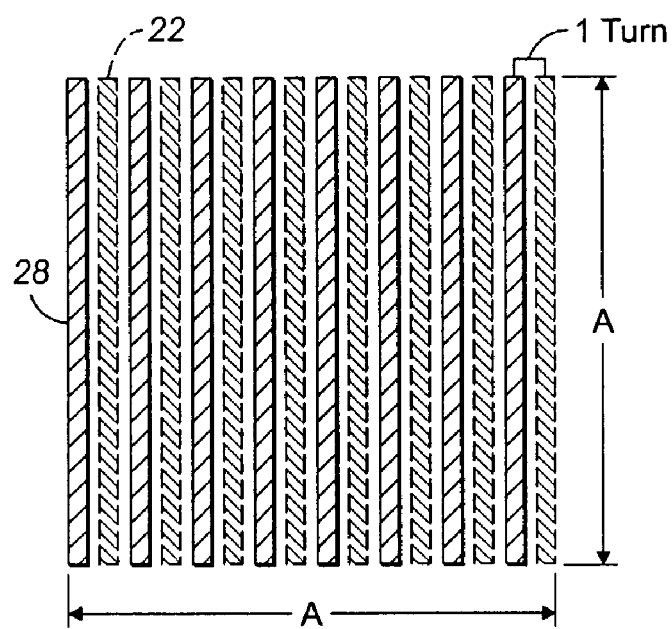
FIG. 8

FABRICATION OF EMBEDDED VERTICAL SPIRAL INDUCTOR FOR MULTICHIP MODULE (MCM) PACKAGE

BACKGROUND

The present invention is directed to integrated circuits, single substrate integrated circuits, and multichip module structures. More particularly, the invention is directed to the design and fabrication of embedded vertical spiral inductors based on multichip module (MCM) technology.

Integration of passive components (resistors, capacitors, inductors) into MCM (Multichip module) package is a new approach to replace surface mounting these components. The basic concept is to remove the required resistors, capacitors and inductors from the MCM surface and insert them into the substrate (including rigid or flexible substrates). This strategy provides greater chip packaging density, lower cost and improves passive device interconnection reliability. Prior art embedded spiral inductors are based on planar (horizontal) configurations as illustrated in FIGS. 1A and 2A. Their fabrication methods are shown in FIGS. 1A and 1B.

Referring now to FIGS. 1A and 1B, the fabrication process for embedding one layer spiral inductor will be described. Referring to now to FIG. 1B, in the first step a planar spiral is formed by depositing pattern bottom metal (e.g. Copper) lines 10 by electroplating on a ceramic or high-resistivity silicon substrate 20. Next, deposition processes defines the vias 14 and insulation 18 and the vias 14 are filled (e.g. Copper) by electroplating. Next, deposit top metal (e.g. Copper) lines 12 for connection by electroplating. Lastly, deposit a top protective layer 16.

Referring now to FIGS. 2A and 2B, the fabrication process for embedding two layer spiral inductor will be described. Referring now to FIG. 2B, in the first step a planar spiral is formed by depositing pattern bottom metal (e.g. Copper) lines 10 by electroplating on a ceramic or high-resistivity silicon substrate 20. Next, deposition processes defines the vias 14 and insulation 18 and the vias 14 are filled (e.g. Copper) by electroplating. Next, deposit top metal (e.g. Copper) lines 12 for connection and for forming the second spiral by electroplating. Lastly, deposit a top protective layer 16.

Device properties such as inductance, quality factor, self-resonant frequency, tolerance, series resistance, parallel capacitance, resistance to ground and capacitance to ground are determined by metal line width, line spacing, line thickness, spiral inner radius, number of turns, total length, inductor area, substrate and encapsulant dielectric constant, substrate conductivity and separation from ground plane. What is needed is a method for fabricating vertical spiral (coil) inductor with or without permeable cores.

SUMMARY

A process for fabricating a vertical spiral inductor within a multichip module package is disclosed. The process consists of depositing a pattern of bottom lines by electroplating copper on a substrate and then depositing an insulation pattern. Next, depositing a pattern of permeable material to form a core and then depositing polyimide to define vias and permeable core insulation. The vias are filled by electroplating copper. The vertical spiral inductor is defined by depositing a pattern of top metal (e.g. copper) lines by electroplating wherein the top metal lines are staggered with respect to the bottom metal lines. Lastly, a top protective layer is deposited. The core may be made from a permeable or non-permeable material.

These together with other objects of the invention, along with the various features of novelty which characterize the invention, are pointed out with particularity in the claims annexed to and forming a part of this disclosure. For a better understanding of the invention, its operating advantages and the specific objects obtained by its uses, reference should be made to the accompanying drawings and descriptive matter in which there are illustrated preferred embodiments of the invention.

DESCRIPTION OF THE DRAWING

FIG. 3 is a top plan view of a vertical spiral inductor with permeable core;

FIG. 4 is a graphical illustration for the fabrication process for embedding a vertical spiral inductor with permeable core;

FIG. 5 is a perspective view of the vertical inductor of FIGS. 3 and 4;

FIG. 6 is a graphical illustration for the fabrication process for embedding a vertical spiral inductor without permeable core;

FIGS. 7 and 8 are top plan views for comparing the geometries of a planar and vertical spiral inductor.

DETAILED DESCRIPTION

Figure 1A:
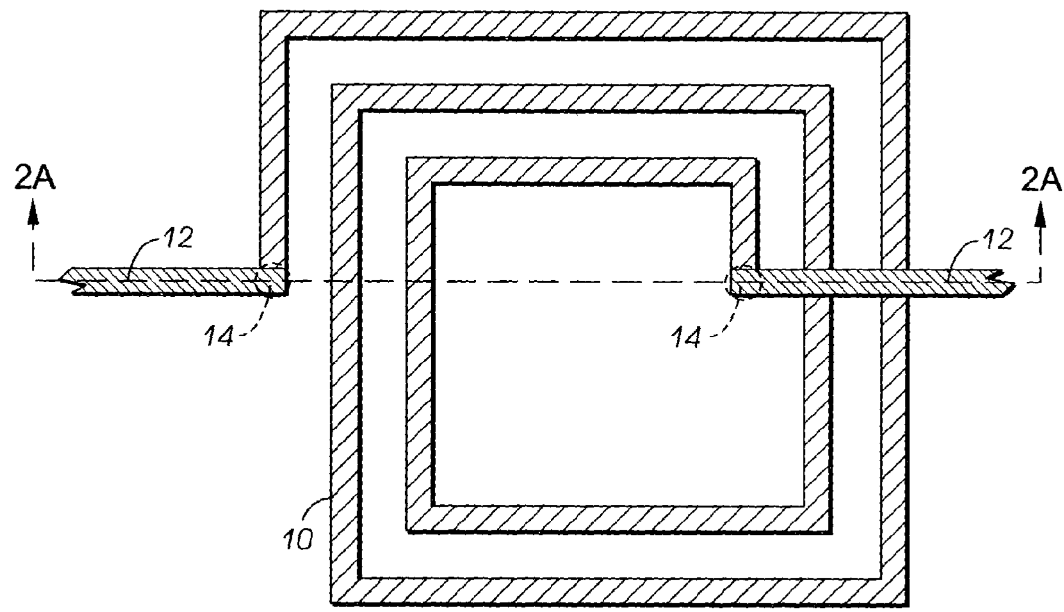
FIG. 1A is a top plan view of a prior art layered spiral inductor.
Figure 2A:
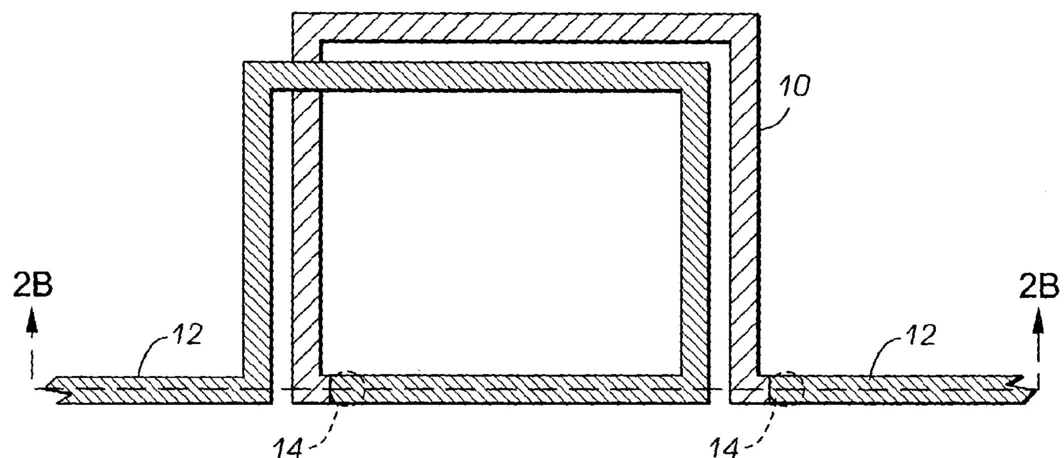
FIG. 2A is a top plan view of a prior art two layered staggered spirals inductor.
Figure 1B:
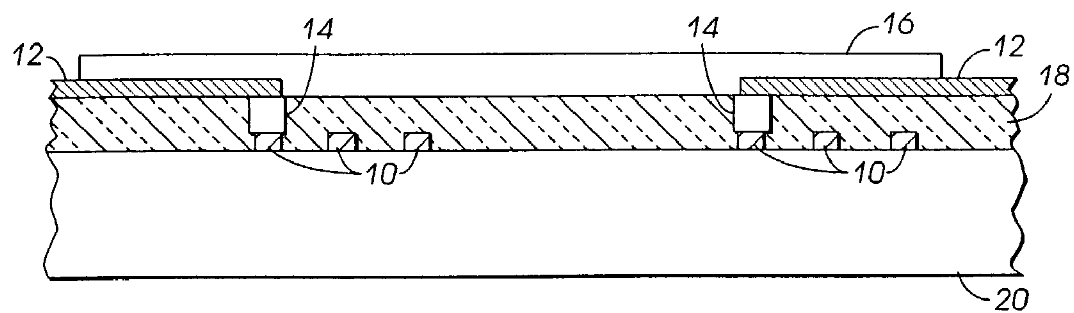
FIG. 1B is graphical illustration for fabricating the spiral inductor of FIG. 1A.
Figure 2B:
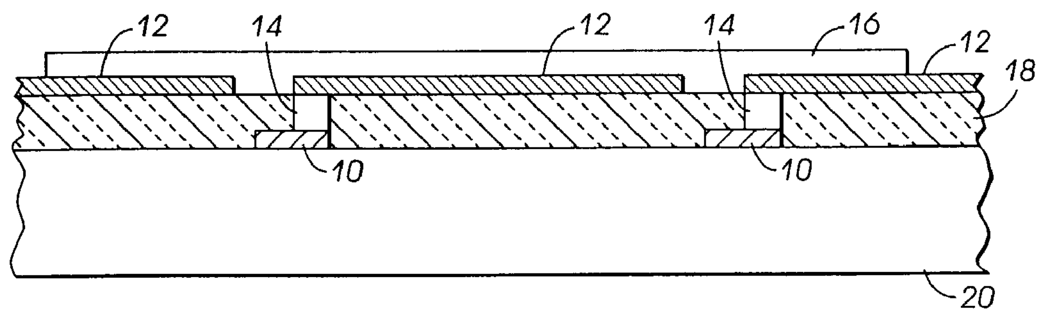
FIG. 2B is graphical illustration for fabricating the spiral inductor of FIG. 2A.

A new and unique process for fabricating vertical spiral (coil) inductors with or without permeable cores is disclosed. In accordance with the present invention, multichip module (MCM) technology for electronics miniaturization and packaging is utilized. The use of MCM and like structures allow for electronic system design on a single substrate. This technology inherently allows for a minimal footprint, volume and mass design. Due to the minimization of parasitics, a higher electrical performance, specifically a higher efficiency, and increased reliability are obtained.

The distinct difference between planar (horizontal) and vertical inductors is there are concentric rings (square or polygon shape) of different radii in the planar configuration whereas the radii of different rings (in various shapes) in the vertical configuration are identical. Also, it should be noted that non-uniform current distribution has been identified for those segments close to the center of the inductor.

Referring now to FIGS. 3 through 5, the fabrication process for embedding a vertical spiral inductor with permeable core will be described. Referring to FIGS. 3 and 4, in the first step a portion of the vertical spiral is formed by depositing pattern bottom metal (e.g. Copper) lines 22 with a thickness of approximately 2 to 3 um by electroplating on ceramic or high-resistivity silicon substrate, or flexible polyimide substrate 20. Next, deposit and pattern polyimide (insulation) 18 with a thickness of approximately 2 um on this area for deposition of the permeable material. In the third step, deposit and pattern permeable material 24 (e.g. Permalloy: 21% Nickel and 79% iron) by electroplating with a thickness of approximately 2 um. Next, deposit polyimide 34 to define vias 14 and permeable core insulation and via 14 filling ( e.g. Copper) by electroplating. Next, deposit and pattern top metal (e.g. Copper) lines 32 by electroplating. Top metal lines 32 are staggered with respect to bottom metal lines 22. Lastly, deposit a top protective layer 30 (e.g. polyimide) with a thickness of approximately 2 um. Lines 26 and 28 represent the end points of the spiral inductor and represent a connection path to either another spiral inductor or an electrical path to another component. FIG. 5 shows a prospective view of the vertical inductor defined by copper coil 40 having a permeable core 42 enclosed by insulating material.

Referring now to FIG. 6, the fabrication process for embedding a vertical spiral inductor without a permeable core will be described. Referring to now to FIG. 6, in the first step a portion of the vertical spiral is formed by depositing pattern bottom metal (e.g. Copper) lines 22 with a thickness of approximately 2 to 3 um by electroplating on ceramic or high-resistivity silicon substrate, or flexible polyimide substrate 20. Next, deposit polyimide 34 to define vias 14 and permeable core insulation and via 14 filling (e.g. Copper) by electroplating. Next, deposit and pattern top metal (e.g. Copper) lines by electroplating. Top metal lines 32 are staggered with respect to bottom metal lines 22. Lastly, deposit a top protective layer 30 (e.g. polyimide) with a thickness of approximately 2 um. Line 28 represents a connection path away from the spiral inductor to another component within the MCM package.

Spiral inductors are primarily used in high frequency application. Realistic values for spiral inductors range from about 1 to 100 nH. Values smaller than 1 nH can be accomplished by simple, straight-line wire segments and values much greater than 100 nH are physically too large and are better made using permeable cores. Some factors that affect the inductance of a coil include: 1. The inductance is proportional to the square of the number of turns; 2. The inductance increases directly as the permeability of the core material increases; 3. The inductance increases directly as the cross-sectional area increases; and 4. The inductance decreases as its length increases. Based on these factors, for a given inductor area and the given metal line width, thickness and spacing, the vertical inductor would give a higher inductance than the horizontal inductor. It is conceivable that for a given area the number of turns of a vertical inductor would be double than that of a horizontal inductor, since in the vertical inductor two lines, 22 and 28 respectively for a given turn can be staggered from both sides of the inductor as shown in FIG. 8. A comparison illustrating the planar spiral having an opute turn radii "A" to the vertical spiral of the present invention with an equivalent turn radii "A" is shown in FIGS. 7 and 8.

The dimension of the inductor, the number of spiral turns, the metal line width and spacing, the selection of permeable core material and its thickness, all these can be tailored to the inductance requirements. For example, using permalloy (79% Nickel and 21% iron relative permeability is about 637) as the permeable core material electroplated to 3 um thick, if the core is 175 um wide and 500 um long, copper line width (spiral) and spacing is 12.5 um, 20 turns of copper can be fabricated over this permeable core. Using the equation:

$$L=N^2\ u\ d\ w/l$$

where L is the inductance, N is the number of turns, u is the permeability of the core, d is the thickness of the core, w is the width of the core, 1 is the length of the core or $$L=N^2 Km\times 4\times 3.4\times 10^{-7}\ d\ w/l$$

where Km is the relative permeability for the core material ($u=Km\ u_0$, $u_0$ is the permeability in free space.)

Substituting the numbers in the equation, the inductance of this tailored vertical spiral inductor is calculated to be 336 nH. By way of example of usage only, an inductor of this value is required by the row driver and PIN diode electronics for acoustic ink jet printheads. Based on this specific structure, other parameters such as quality factor, self resonant frequency, etc., and be studied and investigated.

The use of the low dielectric constant material, polyimide, reduces the parasitic coupling capacitance between metal lines and increases the quality factor and the self-resonant frequency for the RF integrated inductors. Adopting polyimide as the dielectric material makes the fabrication of the intergrated inductors fully compatible with the MCM technology. The staggered double metals spiral structure proposed in this invention would also reduce the parasitic coupling and enhance the Q-factor. Using this proposed method of fabricating vertical spiral inductor with permeable core, embedded inductors with high inductances, e.g. larger than 100 nH can be realized.

Figure 9:
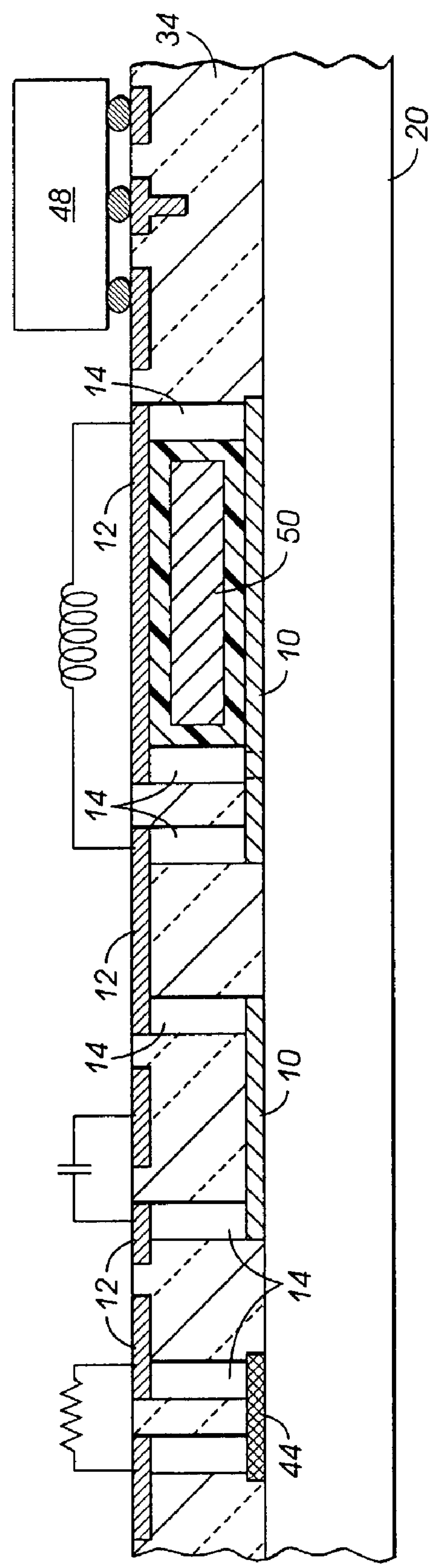
FIG. 9 illustrates the integration of an IC chip of active device with passive devices of inductors, resistors and capacitors on a single substrate within a MCM package.

FIG. 9 illustrates the integration of an IC chip 48 of active device with passive devices of inductors, resistors and capacitors on a single substrate 20 in a MCM package. The MCM package as shown in FIG. 9 is defined by resistor material 44 having metal contacts 10 and 12 respectively utilizing via 14 interconnecting pathways within a polymide material 34 having either a spiral inductor with or without a preamble core 50.

It should further be noted that numerous changes in details of construction and the combination and arrangement of elements may be resorted to without departing from the true spirit and scope of the invention as hereinafter claimed.

What is claimed is:

1. A process for fabricating a vertical spiral inductor within a multichip module package, comprising:

electroplating a pattern of bottom metal lines on a substrate;

depositing an insulation pattern over a portion of the bottom metal lines;

electroplating a pattern of magnetically permeable material to form a magnetically permeable core over a portion of the insulation pattern;

depositing polyimide, wherein the insulation pattern, the pattern of magnetically permeable material and the polyimide are deposited in a pattern that defines vias between the polyimide and a core insulation defined by the insulation pattern at the time of depositing the polyimide;

electroplating the vias to form electrical connectors that connect the bottom metal lines and are exposed at a top surface of the polymide;

electroplating a pattern of top metal lines which is electrically connected to the bottom metal lines through the electrical connectors, wherein the vias are perpendicular to the longitudinal plane of the substrate and the top metal lines and bottom metal lines are arranged to form a number of turns around the core to form the vertical spiral inductor, wherein the top metal lines are staggered with respect to the bottom metal lines; and depositing a top protective layer.

2. The process for fabricating a vertical spiral inductor according to claim 1, wherein the step of electroplating the pattern of bottom metal lines comprises electro-depositing copper lines with a thickness of approximately 2 to 3 um.

3. The process for fabricating a vertical spiral inductor according to claim 1, wherein the substrate is a high-resistivity silicon substrate.

4. The process for fabricating a vertical spiral inductor according to claim 1, wherein the step of depositing the insulation pattern comprises:

depositing polyimide with a thickness of approximately 2 um.

5. The process for fabricating a vertical spiral inductor according to claim 1, wherein the step of electroplating the pattern of magnetically permeable material to form the magnetic permeable core comprises:

electroplating a combination of Permalloy having 21 percent nickel and 79 percent iron with a thickness of approximately 2 to 3 um.

6. The process for fabricating a vertical spiral inductor according to claim 1, further comprises defining an inductance proportional to a square of the number of turns around the core.

7. The process for fabricating a vertical spiral inductor according to claim 1, further comprising defining an inductance which increases directly as permeability of the core material increases.

8. The process for fabricating a vertical spiral inductor according to claim 1, further comprising defining an inductance directly as cross-sectional area increases.

9. The process for fabricating a vertical spiral inductor according to claim 1, further comprising defining an inductance for a coil which decreases as said coil's length increases.

10. The process for fabricating a vertical spiral inductor according to claim 1, further comprising defining an inductance using the equation:

$L=N^2Km\times4\times3.14\times10^{-7}d\ w/l$; wherein L is the inductance, $N^2$ is the number of turns, d is the thickness of the core, w is the width of the core, l is the length of the core and Km is the relative permeability of the core material.

11. The process for fabricating a vertical spiral inductor according to claim 1, wherein the substrate is ceramic.

12. The process for fabricating a vertical spiral inductor according to claim 1, wherein the substrate is a flexible polyimide substrate.

13. A process for fabricating a vertical spiral inductor within a multichip module package, comprising:

electroplating a pattern of bottom metal lines on a substrate;

depositing an insulation pattern over a portion of the bottom metal lines;

depositing a pattern of magnetically non-permeable material to form a magnetically non-permeable core over a portion of the insulation pattern;

depositing polyimide, wherein the insulation pattern, the pattern of magnetically non-permeable material and the polyimide are deposited in a pattern that defines vias between the polyimide and a core insulation at the time of depositing the polyimide wherein the vias are perpendicular to the longitudinal plane of the substrate;

electroplating the vias to form electrical connectors that connect the bottom metal lines and are exposed at a top surface of the polyimide;

electroplating a pattern of top metal lines which is electrically connected to the bottom metal lines through the electrical connectors;

wherein the top metal lines are staggered with respect to the bottom metal lines, the top metal lines and the bottom metal lines are arranged to form a number of turns around the core to form the vertical spiral inductor; and depositing a top protective layer.

14. The process for fabricating a vertical spiral inductor according to claim 13, wherein electroplating the pattern of bottom lines comprises:

electroplating copper lines with a thickness of approximately 2 to 3 um.

15. The process for fabricating a vertical spiral inductor according to claim 13, wherein the substrate is a high-resistivity silicon substrate.

16. The process for fabricating a vertical spiral inductor according to claim 13, wherein depositing the pattern of insulation comprises:

depositing polyimide with a thickness of approximately 2 um.

17. The process for fabricating a vertical spiral inductor according to claim 13, further comprising defining an inductance proportional to a square of the number of turns around the magnetically non-permeable core.

18. The process for fabricating a vertical spiral inductor according to claim 13, further comprising defining an inductance using the equation:

$L=N^2Km\times4\times3.14\times10^{-7}d\ w/l$; wherein L is the inductance, $N^2$ is the number of turns, d is the thickness of the core, w is the width of the core, l is the length of the core and Km is the relative permeability of the core material.

19. The process for fabricating a vertical spiral inductor according to claim 13, further comprising defining an inductance directly as cross-sectional area increases.

20. The process for fabricating a vertical spiral inductor according to claim 13, further comprising defining an inductance for a coil which decreases as said coil's length increases.

21. The process for fabricating a vertical spiral inductor according to claim 13, wherein the substrate is ceramic.

22. The process for fabricating a vertical spiral inductor according to claim 13, wherein the substrate is a flexible polyimide substrate.

23. A process for fabricating a vertical spiral inductor within a multichip module package, comprising:

electroplating a pattern of bottom copper lines with a thickness of approximately 2 to 3 um on a substrate;

depositing a polyimide pattern;

depositing a pattern of magnetically permeable or magnetically non-permeable material to form a core;

depositing polyimide with a thickness of approximately 2 $\mu$m, wherein the polyimide pattern, the pattern of magnetically permeable or magnetically non-permeable material and the polyimide are deposited in a pattern that defines vias between the polyimide and magnetically permeable or magnetically non-permeable core at the time of depositing the polyimide;

electroplating the vias to form electrical connectors that connect the bottom copper lines and are exposed at a top surface of the polyimide;

electroplating a pattern of top copper lines which is electrically connected to the bottom copper lines;

electroplating and patterning the top copper lines wherein the top copper lines are staggered with respect to the bottom copper lines, the top copper lines and the bottom copper lines are arranged to form a number of turns around the core to form the vertical spiral indicator; and depositing a top protective layer.

* * * * *